United States Patent
Matsuda (10) Patent No.: US 10,734,510 B2
(45) Date of Patent: Aug. 4, 2020

(54) SEMICONDUCTOR DEVICE (71) Applicant: SUMITOMO ELECTRIC DEVICE INNOVATIONS, INC., Kanagawa (JP)

(72) Inventor: Hajime Matsuda, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 16/706,432

(22) Filed: Dec. 6, 2019

(65) Prior Publication Data
US 2020/0127129 A1 Apr. 23, 2020

Related U.S. Application Data

(62) Division of application No. 15/863,393, filed on Jan. 5, 2018, now Pat. No. 10,541,322.

(30) Foreign Application Priority Data

Jan. 6, 2017 (JP) .................. 2017-001304

(51) Int. Cl.
*H01L 21/02* (2006.01)
*H01L 29/778* (2006.01)
*H01L 29/51* (2006.01)
*H01L 29/40* (2006.01)
*H01L 29/66* (2006.01)
*H01L 29/20* (2006.01)
*H01L 29/423* (2006.01)

(52) U.S. Cl.
CPC ...... *H01L 29/7783* (2013.01); *H01L 21/0217* (2013.01); *H01L 21/0254* (2013.01); *H01L 21/0262* (2013.01); *H01L 21/02211* (2013.01); *H01L 21/02274* (2013.01); *H01L 21/02458* (2013.01); *H01L 21/02579* (2013.01); *H01L 29/408* (2013.01); *H01L 29/518* (2013.01); *H01L 29/66462* (2013.01); *H01L 29/7787* (2013.01); *H01L 29/2003* (2013.01); *H01L 29/42316* (2013.01)

(58) Field of Classification Search
CPC ............. H01L 29/2003; H01L 29/7787; H01L 21/0228
See application file for complete search history.

(56) References Cited

U.S. PATENT DOCUMENTS

2017/0117402 A1* 4/2017 Koyama ............. H01L 21/3245
2017/0133499 A1* 5/2017 Mizue ................ H01L 29/7786

FOREIGN PATENT DOCUMENTS

JP 2008-205392 9/2008
JP 2011-82552 4/2011

* cited by examiner

*Primary Examiner* — Jaehwan Oh
(74) *Attorney, Agent, or Firm* — Smith, Gambrell & Russell, LLP.

(57) ABSTRACT

A process for forming a nitride semiconductor device is disclosed. The resulting semiconductor device includes a semiconductor stack with a top layer containing gallium (Ga) and nitrogen (N), electrodes of a source, a gate and a drain provided on the semiconductor stack, and a silicon nitride (SiN) film provided on the GaN layer between the drain electrode and the gate electrode but apart from the gate electrode. The SiN film has a silicon rich composition with a composition ratio of Si/N that is greater than ¾ and substantial oxygen contents.

9 Claims, 8 Drawing Sheets

SEMICONDUCTOR DEVICE

CROSS REFERENCE TO RELATED APPLICATIONS

The present application is based upon and claims the benefit of priority under 35 USC 119 of Japanese Patent Application No. 2017-001304 filed on Jan. 6, 2017, the entire disclosure of which is incorporated herein by reference in its entirety. The present application also is a division of U.S. application Ser. No. 15/863,393 filed on Jan. 5, 2018 and likewise incorporates the entire disclosure of said U.S. application herein.

BACKGROUND OF INVENTION

1. Field of Invention

The present invention relates to a semiconductor device, in particular, the invention relates to a semiconductor device primarily made of nitride semiconductor materials.

2. Background Art

Semiconductor devices with a type of filed effect transistor (FET) primarily made of nitride semiconductor materials are generally formed by epitaxially growing the nitride semiconductor materials on a substrate. Such a semiconductor device inherently provides a two-dimensional electron gas (2DEG) at interface between a channel layer and a barrier layer, exactly, in the channel layer at the interface against the barrier layer. The 2DEG is conducted by biases applied between a source electrode and a drain electrode and modulated by a signal applied to a gate electrode. A Japanese Paten Application layer open No. JP2011-082552A has discloses an FET including an n-type gallium nitride (GaN) layer on the barrier layer. Another Japanese Patent Application laid open No. JP2008-205392A has disclosed an FET providing a dual passivation layer made of silicon nitride (SiN) with a Si-rich composition and another SiN layer with a stoichiometric composition.

An n-type GaN layer disclosed in the former prior art may enhance the current to voltage (I-V) characteristic of a semiconductor device. However, the conductive GaN layer increases a leak current. While, an SiN film with the Si-rich composition degrades, what is called, the current collapsing because excess Si atoms in the SiN film may extract nitrogen (N) atoms in the GaN layer, in other word, excess Si atoms easily bind with N atoms, which causes vacancies in the GaN layer and accordingly, increasing deep traps.

SUMMARY OF INVENTION

An aspect according to the present invention relates to a nitride semiconductor device that includes a substrate, a semiconductor stack, a gate electrode and a source electrode, and a first insulating film. The semiconductor stack includes semiconductor layers having at least a top layer including gallium (Ga) and nitrogen (N). The gate electrode and the drain electrode are provided on the top layer of the semiconductor stack. The first insulating film, which may be made of silicon nitride (SiN), is provided on the top layer of the semiconductor stack between the gate electrode and the drain electrode but apart from the gate electrode. Features of the nitride semiconductor device according to the present invention are that the first insulating film has a composition ratio of silicon against nitrogen (Si/N) greater than ¾; and the top layer of the semiconductor stack in a portion in contact with the first insulating film has substantial oxygen contents.

The second aspect according to the present invention relates to a process of forming a nitride semiconductor device on a substrate. The process includes steps of: (a) growing a semiconductor stack on the substrate; (b) forming a first insulating film on a top layer of the semiconductor stack; (c) forming a drain electrode; (d) forming a gate electrode, and (e) covering the gate electrode, the drain electrode, and the first insulating film between the gate electrode and the drain electrode by a second insulating film. The semiconductor stack provides at least a top layer containing gallium (Ga) and nitrogen (N) and doped with silicon (Si). The first insulating film is made of silicon nitride (SiN) and formed by a plasma-enhanced chemical vapor deposition (p-CVD) technique. The drain electrode is formed by depositing ohmic metals on the semiconductor stack so as to have a portion overlapping with the first insulating film and subsequent alloying the ohmic metals. The gate electrode is formed on the semiconductor stack so as to be apart from the first insulating film. The second insulating film is also formed by the p-CVD technique.

One of features of the process is that the p-CVD technique for forming the first and second insulating films supplies silane ($SiH_4$) and nitrogen ($N_2$) as source gases for silicon (Si) and nitrogen (N) with a flow rate of SiH4 for the first insulating film that is greater than a flow rate of $SiH_4$ for the second insulating film. Another feature of the process according to the present invention is that the p-CVD technique for forming the second insulating film uses a frequency higher than a frequency of the p-CVD technique for forming the first insulating film.

DESCRIPTION OF EMBODIMENT

Next, some embodiments according to the present invention will be described as referring to accompanying drawings. In the description of the drawings, numerals or symbols same with or similar to each other will refer to elements same with or similar to each other without duplicating explanations.

First Embodiment

Figure 1A:
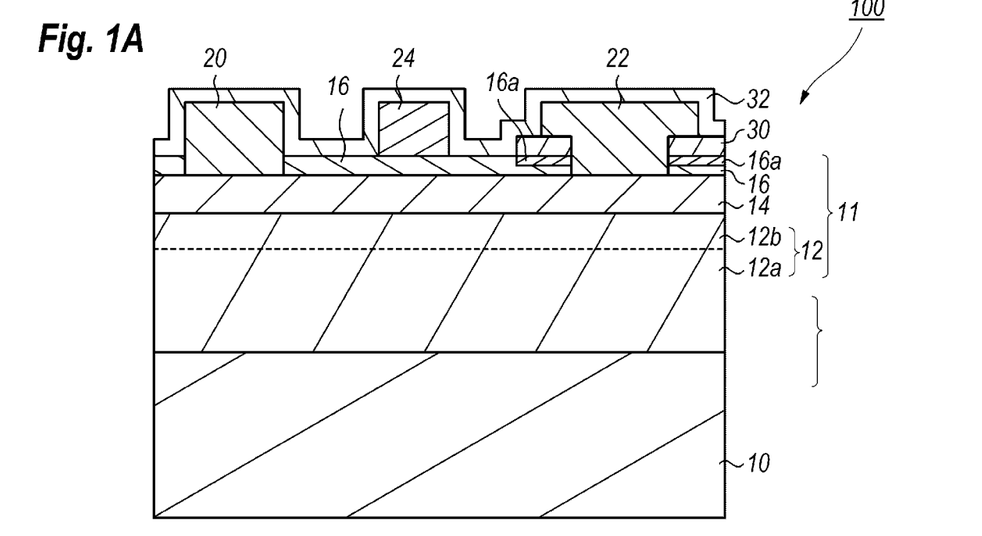
FIG. 1A shows a cross section of a semiconductor device according to the first embodiment of the present invention, where the cross section is taken along the line IA-IA indicated in FIG. 1B.
Figure 1B:
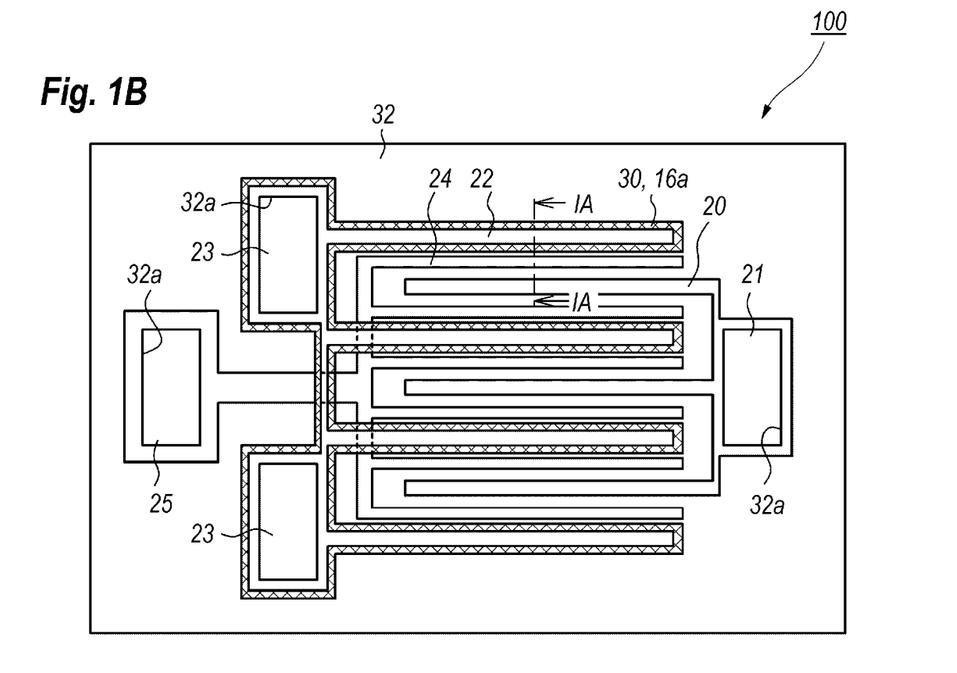
FIG. 1B is a plan view of the semiconductor device shown in FIG. 1.
Figure 2A:
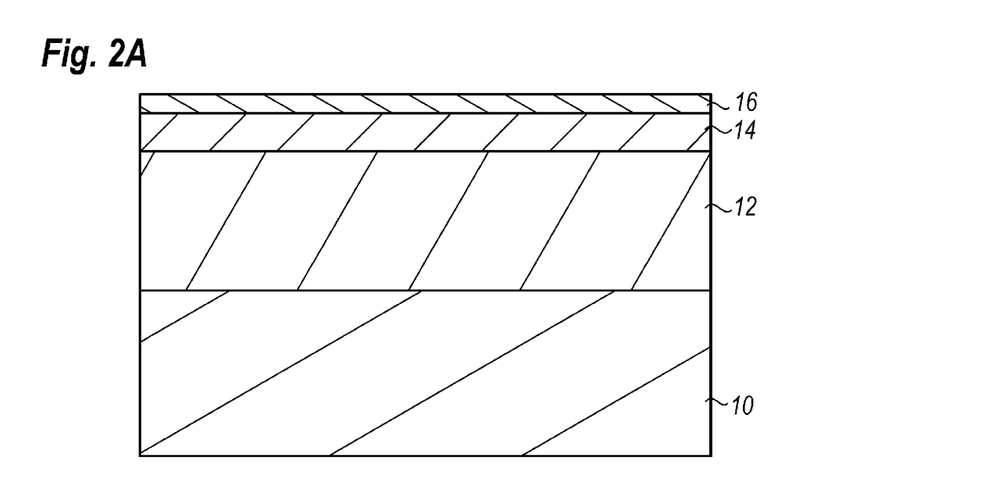
FIG. 2A and FIG. 2B show cross sections of the semiconductor device shown in FIG. 1 at respective processes of forming the semiconductor device.
Figure 2B:
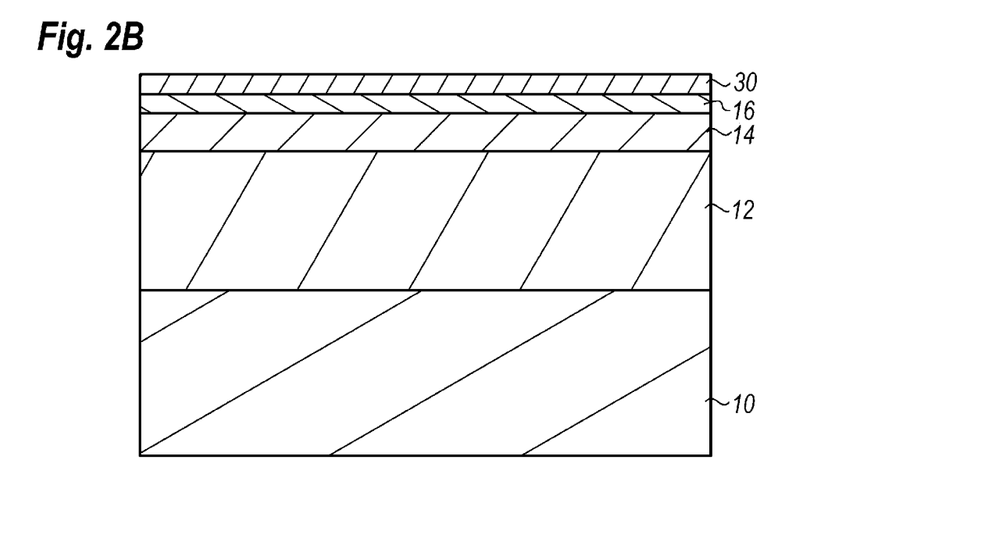

FIG. 1A shows a cross section of a semiconductor device 100 according to the first embodiment of the present invention, where FIG. 1 is taken along the line IA-IA indicated in FIG. 1B; and FIG. 1B is a plan view of the semiconductor device 100. The semiconductor device 100 is a type of high electron-mobility transistor (HEMT) that provides a substrate 10 and a semiconductor stack 11 epitaxially grown on the substrate 10. The semiconductor stack 11 includes a gallium nitride (GaN) layer 12, a barrier layer 14 and a cap layer 16 made of GaN. The cap layer 16 provides electrodes of a source 20, a drain 22, and a gate 24 thereon. Besides, the cap layer 16 in portions between the electrodes, 20 to 24, provides insulating films, 30 and 32, each made of silicon nitride (SiN).

In FIG. 1B, which is the plan view of the semiconductor device 100, where hatched areas correspond to an SiN film 30, which will be called as the first insulating film, and an oxide layer 16a. The electrodes of the source 20, the drain 22, and the gate 24 have an arrangement including respective fingers. The fingers of the electrodes of the source 20, the drain 22, and the gate extend to a source pad 21, drain pads 23, and a gate pad 25, respectively.

The substrate 10 may be made of insulating or semi-insulating material such as silicon carbide (SiC). The GaN layer 12 may be made of un-doped GaN with a thickness of 0.75 μm. The GaN layer 12 may be distinguished in two parts, one of which is a lower part 12a operable as a buffer layer for an epitaxial growth, while another is an upper layer 12b operable as a channel layer. The barrier layer 14, which operates as an electron supplying layer, may be made of n-type AlGaN with an aluminum (Al) composition of 0.22 and a thickness of 24 nm. The other GaN layer 16 may be made of n-type GaN with a thickness of 5 nm. The barrier layer 14 and the GaN layer 16 may be doped with silicon (Si) by density of $1 \times 10^{18}$ cm$^{-3}$.

The source electrode 20 and the drain electrode 22, which are ohmic electrodes, may be formed by alloying stacked metals of tantalum (Ta) with thickness of 6 nm, aluminum (Al) with a thickness of 300 nm, and another tantalum (Ta) with a thickness of 6 nm, from the side of the GaN layer 16. The gate electrode 24 stacks metals of nickel (Ni) with a thickness of 60 nm, palladium (Pd) with a thickness of 40 nm, gold (Au) with a thickness of 350 nm, and tantalum (Ta) with a thickness of 10 nm. The gate electrode 24 may have a length of 0.6 μm in the present embodiment. The source electrode 20 and the drain electrode 22 are in contact with the barrier layer 14, while, the gate electrode 24 is in contact with the GaN layer 16.

Table 1 below summarizes conditions of the two insulating films, 30 and 32, each made of SiN.

TABLE 1

| film | thickness | Oxygen contents [atomic %] | refractive index |
|---|---|---|---|
| SiN film 30 | 20 | 7.5 | 2.30 |
| SiN film 32 | 40 | 3.0 | 2.05 |

As summarized in Table 1 above, the insulating film 30, which may be referred to the first SiN film, has the oxygen contents greater than that in the latter SiN film, which may be referred to the second SiN film. Exactly, the oxygen content of the first SiN film 30 is almost twice of that of the second SiN film 32'. Besides, the first SiN film 30 has refractive index greater than that of the second SiN film 32, which means that the first SiN film 30 has a composition ratio of silicon against nitrogen, namely, Si/N, different from that of the second SiN film 32; specifically, the second SiN film 32 has a substantially stoichiometric composition ratio of silicon against nitrogen, namely, Si/N=¾=0.75. On the other hand, the first SiN film 30 has a silicon (Si) rich composition with the ratio Si/N greater than 0.75, specifically, the ratio Si/N of the first SiN film 30 is about 0.9.

The first SiN film 30 localizes between the drain electrode 22 and the gate electrode 24, exactly, closer to the drain electrode 22 between the drain electrode 22 and the gate electrode 24; but apart from the gate electrode 24. The GaN layer 16 induces an oxide layer 16a including gallium oxide ($Ga_2O_3$) in a portion in contact with the first SiN film 30, where the oxide layer 16a has oxygen contents greater than that in rest of the GaN layer 16 by 1 to 2 atomic percent. The oxide layer 16a may be formed by reaction between oxygen (O) in the first SiN film 30 and gallium (Ga) in the GaN layer 16. The GaN layer 16, which is doped with Si, except for the oxide layer 16a has silicon (Si) concentration higher that the silicon (Si) concentrating in the oxide layer 16a.

Referring to FIG. 1A again, the drain electrode 22 is in contact with the electron supplying layer 14, the first SiN film 30, exactly top and side surfaces thereof, and a side of the oxide layer 16a. Also, referring to FIG. 1B, the first SiN film 30 and the oxide layer 16a surround the drain electrode 22, but the first SiN film 30 and the oxide layer 16a are apart from the source electrode 20 and the gate electrode 24.

Table 2 below summarizes conditions for growing the semiconductor stack 11 of the present embodiment. In Table 2, symbols TMA, TMG, NH$_3$, and SiH$_4$ mean tri-methyl-aluminum, tri-methyl-gallium, ammonia, and silane, respectively. Also, symbols sccm and slm mean standard cc per minute and standard liter per minute. One (1) torr corresponds to 133.3 Pa, while one sccm is equal to $1.667 \times 10^{-8}$ m$^3$/sec, and one slm is e $1.667 \times 10^{-11}$ m$^3$/sec.

TABLE 2

| | | growth conditions | | |
|---|---|---|---|---|
| layer | thickness (nm) | pressure (torr) | temperature | sources flow rates |
| GaN layer 12 | 750 | 100 | 1060 | TMG: 54 sccm NH$_3$: 20 slm |
| AlGaN barrier layer | 24 | | | TMG: 54 sccm TMA: 90 sccm NH$_3$: 20 slm SiH$_4$: 8 sccm |
| GaN layer 16 | 5 | | | TMG: 43 sccm NH$_3$: 20 slm SiH$_4$: 400 sccm |

FIG. 2A to FIG. 6B show cross sections of the semiconductor device 100 at respective steps of the process for forming the semiconductor device 100. The process first sequentially and grows the semiconductor stack 11 including the GaN layer 12, the electron supplying layer 14, and the cap layer 16 epitaxially on the substrate 10 by the metal organic chemical vapor deposition (MOCVD) technique. Thereafter, a plasma-enhance chemical vapor deposition (p-CVD) technique deposits the first SiN film 30 with a thickness of 20 nm on the GaN layer 16 as shown in FIG. 2B. Conditions of the p-CVD are a frequency of 13.56 MHz, power of 50 W, and source gases of silane ($SiH_4$), nitrogen (N) and helium (He) of 4 sccm, 1500 sccm, and 500 sccm, respectively. The source gases may further include ammonia ($NH_3$) for nitrogen (N). Residual oxygens (O) left within a deposition apparatus of the p-CVD are inherently captured within a deposited SiN film 30. That is, the composition ratio of Si/N in the first SiN film 30 may be determined by the flow rates of the source gases, the frequency and the power of the plasma. An increased flow rate of silane ($SiH_4$) may deposit a Si-rich SiN film and increase the oxygen content therein compared with the second SiN film 32 that is described later.

Figure 3A:
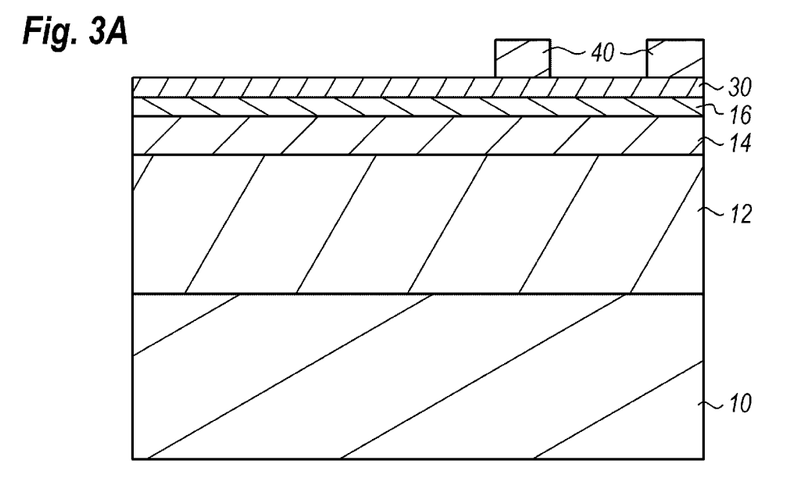
FIG. 3A and FIG. 3B show cross sections of the semiconductor device at respective processes subsequent to the process shown in FIG. 2B.
Figure 3B:
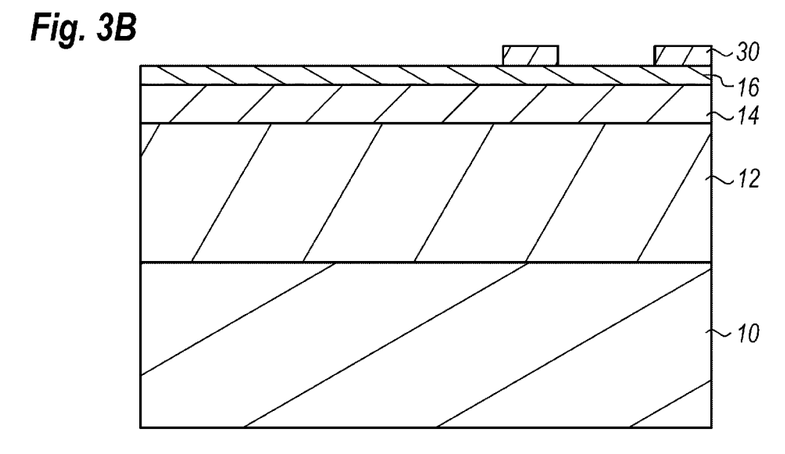
Figure 4A:
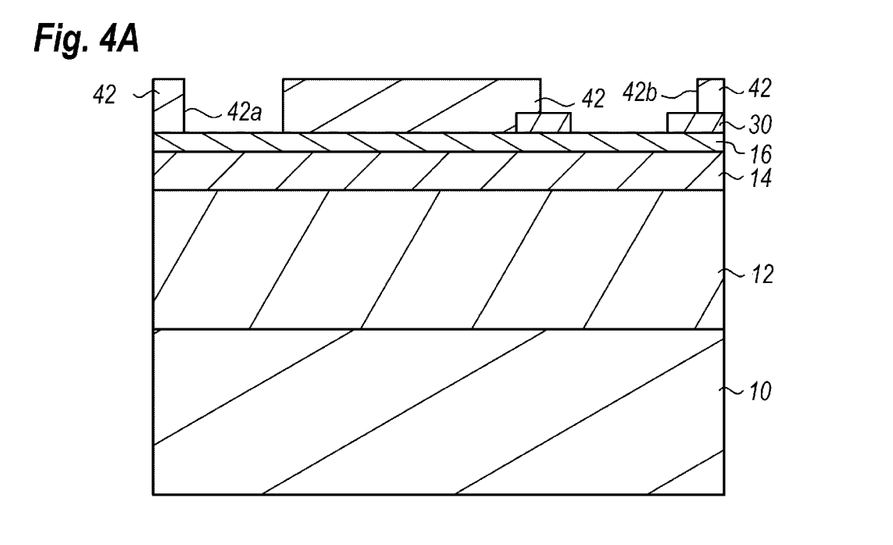
FIG. 4A and FIG. 4B show cross sections of the semiconductor device at respective processes subsequent to the process shown in FIG. 3B.
Figure 4B:
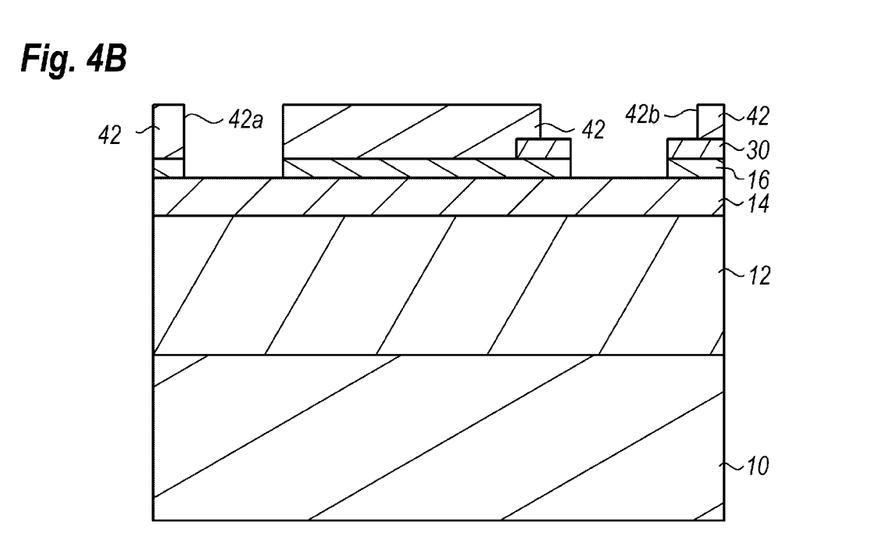

Thereafter, a patterned photoresist 40 is prepared on the first SiN film 30 as shown in FIG. 3A. A dry-etching of a reactive ion etching (RIE) may remove portions of the first SiN film 30 exposed from the patterned photoresist 40 so as to leave rest portions thereof thereunder. The patterned photoresist 40 is removed after the RIE process, as shown in FIG. 3B. Thereafter, as shown in FIG. 4A, another patterned photoresist 42 is prepared on the GaN layer 16 and the first SiN film 30, where the patterned photoresist 42 provides openings, 42a and 42b, in positions where the source electrode 20 and the drain electrode 22 are to be formed. The opening 42a exposes the GaN layer 16, while, the other opening 42b exposes the surface of the SiN file 30 and the GaN layer 16 surrounded by the SiN film 30. The surface of the GaN layer 16 is exposed within the openings, 42a and 42b. The RIE process with a source gas containing, for instance, chlorine (Cl) may remove the GaN layer 16 exposed within the openings, 42a and 42b, so as to expose the surface of the electron supplying layer.

Figure 5A:
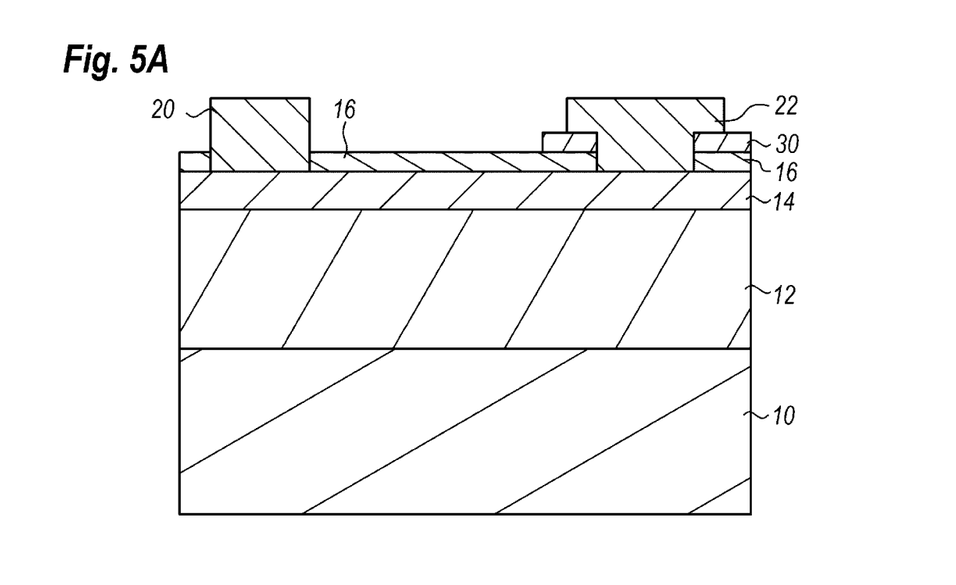
FIG. 5A and FIG. 5B show cross sections of the semiconductor device at respective processes subsequent to the process shown in FIG. 4B.
Figure 5B:
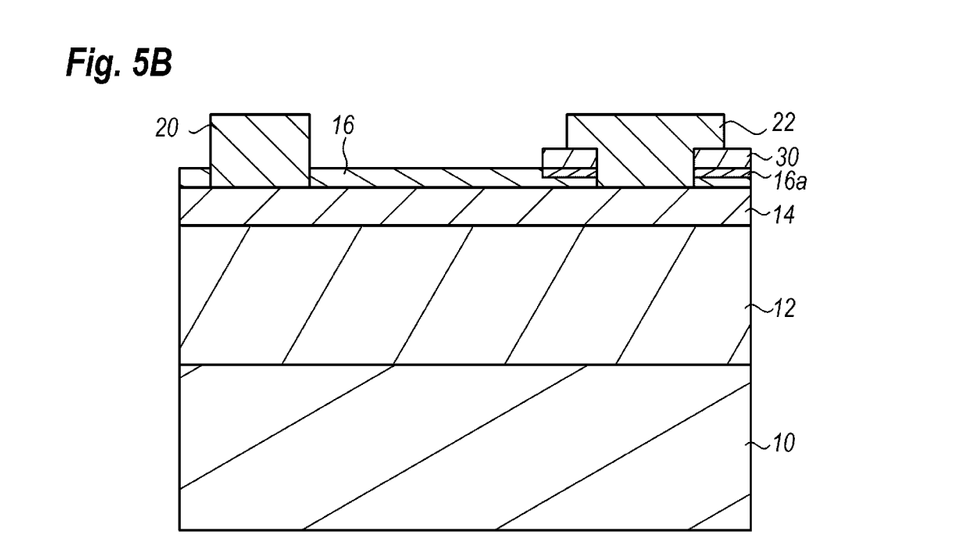

Thereafter, a metal evaporation and a metal lift-off carried out subsequent to the metal evaporation may leave the stacked metal of Ta/Al/Ta in portions corresponding to the source electrode 20 and the drain electrode 22. The stacked metal left in the area for the drain electrode 22 is provided on the first SiN layer and the electron supplying layer 16. Alloying the stacked metal, for instance, at 560° C., in an inactive atmosphere, such as nitrogen ($N_2$); the source electrode 20 and the drain electrode 22 may be formed in contact with the barrier layer 14. The alloy of the stacked metal may also accelerate the reaction, or the inter-diffusion, between oxygen (O) in the first SiN film 30 and gallium (Ga) in the GaN layer 16. Thus, the oxide layer 16a is left in an interface between the GaN layer 16 and the SiN film 30, as shown in FIG. 5B.

Figure 6A:
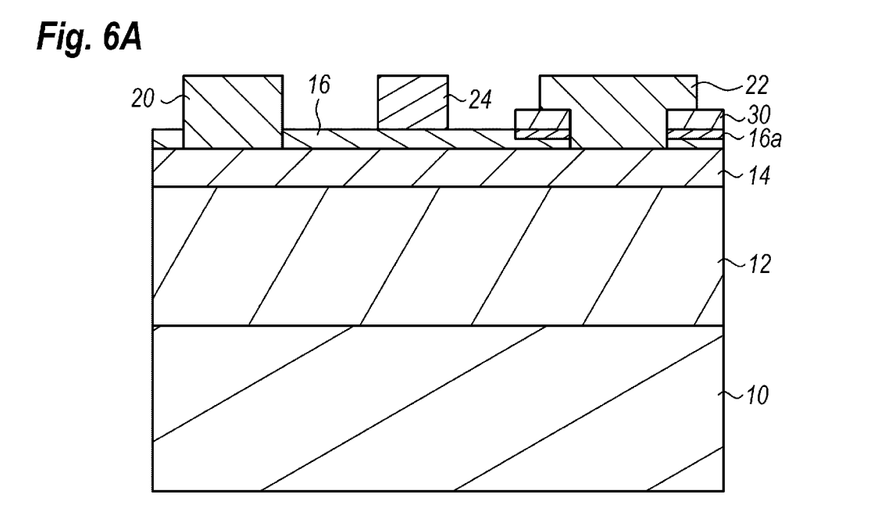
FIG. 6A and FIG. 6B show cross sections of the semiconductor device at respective processes subsequent to the process shown in FIG. 5B.
Figure 6B:
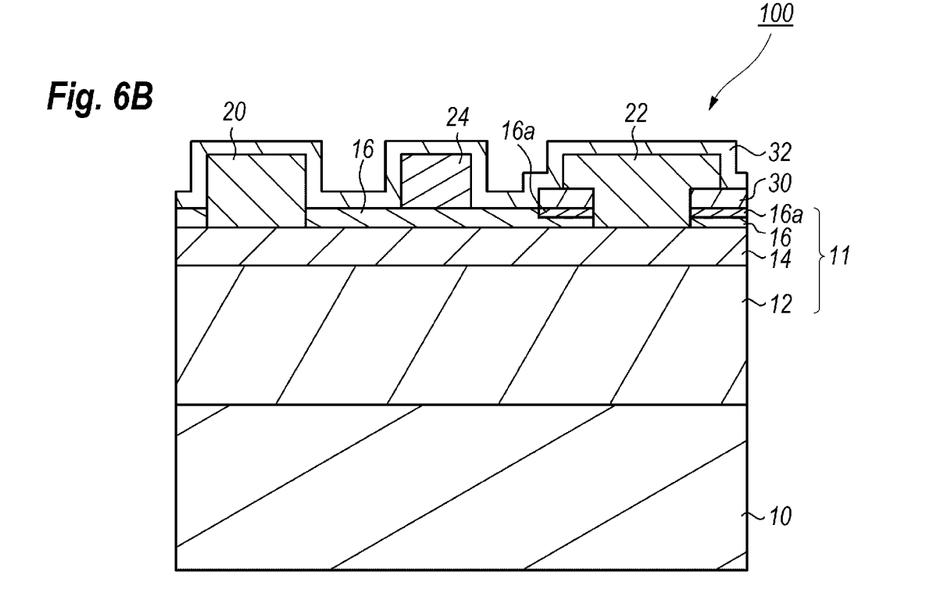

Thereafter, as shown in FIG. 6A, performing the metal evaporation and the subsequent metal-lift off, the gate electrode 24 is formed on the GaN layer 16 between the source electrode 20 and the drain electrode 22. Finally, the p-CVD technique may form the second SiN film 32 so as to cover the electrodes, 20 to 24, and the GaN layer 16 between the electrodes, 20 to 24. The deposition conditions of the p-CVD technique for the second SiN film 32 are, the frequency and the power of the plasma are 13.56 MHz and 50 W, respectively, and the flow rates of nitrogen ($N_2$) and helium (He) are 1500 sccm and 500 sccm, respectively, where those conditions are same with those for the first SiN film 30. However, the flow rate of silane ($SiH_4$ is 3 sccm that is smaller than that for the first SiN film 30 by one (1) sccm, which may deposit the second SiN film 32 with smaller oxygen content and a smaller Si composition. Forming openings 32 in the respective pads, 21 to 25, for the source, the drain, and the gate as shown in FIG. 1B; the process of forming the semiconductor device 100 shown in FIGS. 1A and 1B is completed.

The semiconductor device 100 according to the first embodiment provides the n-type GaN layer 16, which is the topmost layer of the semiconductor stack 11, and this n-type GaN layer 16, which has the conduction type same with the carrier, namely, electrons; accordingly, the n-type GaN layer 16 may lift, or further bend the conduction band thereof upward, the energy band diagram at the interface between the electron supplying layer 14 and the GaN layer 16. Such a band diagram may compensate influence by holes at the interface between the GaN layer 16 and the AlGaN electron supplying layer 14, and the semiconductor device 100 may stabilize an I-V characteristic between the gate electrode 24 and the drain electrode 22.

A drain bias applied to the drain electrode 22 may cause a large electric field near the drain electrode 22, which exposes deep levels, deep traps, or surface states, whose energy levels exist within the forbidden band. Those levels affect the hole current and the current collapse of the FET. On the other hand, the doping concentration, exactly, the silicon (Si) concentration in the GaN layer 16 around the drain electrode 22 affects the leak current between the gate electrode and the drain electrode. According to the semiconductor device 100 of the first embodiment, the first SiN film 30, which is provided on the GaN layer 16 between the drain electrode 22 and the gate electrode 24, is in contact with the drain electrode 22 but apart from the gate electrode 24. Because the SiN film 30 has the silicon (Si) rich composition, which means that the SiN film 30 contains many Si—H bonds and causes many active silicon (Si) atoms that are uncoupled with hydrogens (H) during the thermal treatment, or alloying, of ohmic metals. Those active Si atoms may terminate dangling bonds in the surface of the GaN layer 16 and stabilize or compensate the surface states above mentioned. Thus, the FET according to the first embodiment may suppress the current collapse caused by the surface states of the GaN layer 16.

Excess silicon (Si) atoms in the first SiN film 30 possibly capture nitrogen (N) in the GaN layer 16; but the present embodiment provides the first SiN film 30 with greater oxygen (O) contents, where oxygen (O) atoms in the first SiN film 30 may couple with gallium (Ga) atoms in the GaN layer 16 left after the capture of nitrogen (N) atoms by the excess Si atoms in the first SiN film 30, which means that the GaN layer 16 in a region in contact with the first SiN film 30, namely, the oxide layer 16a increases the oxygen contents thereof compared with other regions not in contact with the first SiN film 30. Thus, the present embodiment may effectively suppress vacancies due to the dissociation of nitrogen (N) atoms in the GaN layer 16, and the current collapse due to the vacancies in the GaN layer 16 may be suppressed. Besides, the oxide layer 16a containing much oxygen (O) atoms may enhance a breakdown voltage between the drain electrode 22 and the gate electrode 24, which may decrease the drain leak current of the semiconductor device 100.

The second SiN film 32 substantially has stoichiometric composition, which means that the second SiN film 32 contains less Si—H bond and accordingly less active silicon (Si) atoms possibly generated by, for instance, a thermal treatment thereof. Besides, the second SiN film 32 is deposited after the alloy of the ohmic metals. Thus, the GaN layer 16 in a portion in contact with the second SiN film 32 is hard to dissociate nitrogen (N) and decreases vacancies. That is, the GaN layer 16 in regions around the source electrode 20 and the gate electrode 24 is hard to dissociate nitrogen (N) atoms therefrom; thus, the current collapse due to the vacancies of nitrogen (N) may be effectively suppressed. Because the second SiN film 32 has relatively greater resistivity compared with the first SiN film 30, leak current flowing in the first SiN film 30 becomes dominate but the absolute thereof is still small enough.

When a semiconductor device provides the first SiN film 30 with excess oxygen atoms therein in a whole surface of the GaN layer 16, such a semiconductor device seems to enhance performances thereof, in particular, such a semiconductor device seems to further reduce the drain leak current. However, excess oxygen (O) atoms in the first SiN film 30 may capture or coupled with silicon (Si) atoms in the GaN layer 16, which is captured as an n-type dopant in the GaN layer 16; accordingly, the GaN layer 16 decreases the silicon (Si) concentration and increases the contribution by the hole transportation across the hetero interface between the AlGaN electron supplying layer 14 and the GaN cap layer 16. Accordingly, the first SiN film 30 is preferably apart from the gate electrode 24, and also from the source electrode 20. Thus, the doping concentration of silicon (Si) atoms in the GaN layer 16 around the gate electrode 24 and between the gate electrode 24 and the source electrode 20 may keep the original doping concentration.

The oxide layer 16a may provide a region of $Ga_2O_3$ originated from oxygen (O) in the first SiN film 16 and gallium (Ga) in the GaN layer 16. Because gallium oxide ($Ga_2O_3$) has bandgap energy far greater than that of gallium nitride (GaN), which means that the existence of the oxide layer 16a may bend the band profile of the GaN layer 16 upward at the interface therebetween, which may decrease the leak current flowing in a region of the GaN layer 16 in contact with the oxide layer 16a.

Excess oxygen (O) atoms in the first SiN film 30 may bind not only with gallium (Ga) atoms in the GaN layer 16, which resultantly forms the oxide layer 16a, but also silicon (Si) atoms involved in the GaN layer 16 as the n-type dopant, which forms silicon die-oxide ($SiO_2$). Accordingly, the doping concentration of silicon (Si) atoms around the drain electrode 22 substantially decrease, which increases the resistivity between the gate electrode 24 and the drain electrode 23, and resultantly decreases the leak current therebetween.

The GaN layer 16 in the region not in contact with the first SiN layer 30 has the doping concentration of silicon (Si) atoms higher than that in the region in contact with the first SiN film 30, namely, the oxide layer 16a. Accordingly, silicon (Si) atoms as the dopant elements may compensate the hole transportation, or the hole generation, around the source electrode 20 and the gate electrode 24, which may enhance the I-V characteristic of the semiconductor device 100. The GaN layer 16 may have the doping concentration of silicon (Si) atoms of around $1 \times 10^{18}$ cm$^{-3}$ in the region not in contact with the oxide layer 16a.

The first SiN film 30 may have a Si-rich composition, that is the composition ratio Si/N in the first SiN film 30 is greater than $3/4$ (=0.75), which is the composition ratio of the second SiN film 32. A Si-rich SiN film generally has refractive index higher than refractive index of a SiN film with the stoichiometric composition, which is the second SiN film 32 in the present embodiment. Because an excess silicon (Si) atoms in the first SiN film 30 may terminate dangling bonds exposed on the surface of the GaN layer 16, the surface states in the GaN layer 16 may be decreased and accordingly suppress the current collapse.

The second SiN film 32, on the other hand, preferably provides the stoichiometric composition with the ratio Si/N of 0.75, which may keep the doping concentration of silicon (Si) atoms around the source electrode 20 and the gate electrode 24 in the original concentration; and the hole transportation there may be effectively suppressed. Besides, the second SiN film 32 may effectively suppress the dissociation of nitrogen (N) from the GaN layer 16 in the region around the source electrode 20 and around the gate electrode 24. The second SiN film 32 may have the composition closer to the stoichiometric composition compared with that of the first SiN film 30.

The semiconductor device 100 of the present embodiment may provide the layer 12 made of materials except for GaN, and the layer 14 made of materials except for AlGaN. For instance, the layer 12 may be made of AlGaN, while, the layer 14 may be made of indium aluminum nitride (InAlN), and so on.

The first SiN film 30 and the second SiN film 32 may be deposited by conditions different from those described above, where the aforementioned condition increases the flow rate of silane ($SiH_4$) for increasing the doping concentration of silicon (Si) and oxygen content therein. For instance, a change of the RF signal may vary the doping concentration of silicon (Si) atoms and the oxygen (O) contents therein.

Specifically, the first SiN film 30 may be deposited under conditions of the frequency and the power of the RF signal; and the flow rates of silane ($SiH_4$) and nitrogen (N) of 375 kHz, 50 W; 45 sccm and 1500 sccm, respectively. That is, the supplement of helium (He) is ceased and the frequency of the RF signal is lowered to 375 kHz. Under such conditions, the first SiN film 30 with the composition ratio Si/N greater than the stoichiometric composition and the oxygen (O) content of about 7.5 may be deposited.

The drain electrode 22 may extend onto the first SiN film 30 and in contact with the side of the first SiN film 30. In an alternative, the first SiN film 30 is put between the gate electrode 24 and the drain electrode 22 but preferably apart from the gate electrode 24. The second SiN film 32 may fully cover the electrodes of the source 20, the drain 22, and the gate 24; and also the GaN layer 16 between the electrodes, 20 to 24.

The ohmic electrodes, namely, the source electrode 20 and the drain electrode 22 may be formed by alloying the stacked metals of tantalum (Ta), aluminum (Al), and another tantalum (Ta) at a temperature higher than 550° C., specifically, at a temperature of 500 to 600° C. for forming the oxide layer 16a. The heat treatment for alloying the metals forms the oxide layer 16a by reacting gallium (Ga) in the GaN layer 16 with oxygen (O) in the first SiN film 30. Although the present embodiment provides the source electrode 20 and the drain electrode 22 in contact with the barrier layer 14 in order to decrease contact resistance there to, those electrodes, 20 and 22, may be provided on the GaN layer 16.

Second Embodiment

Figure 7:
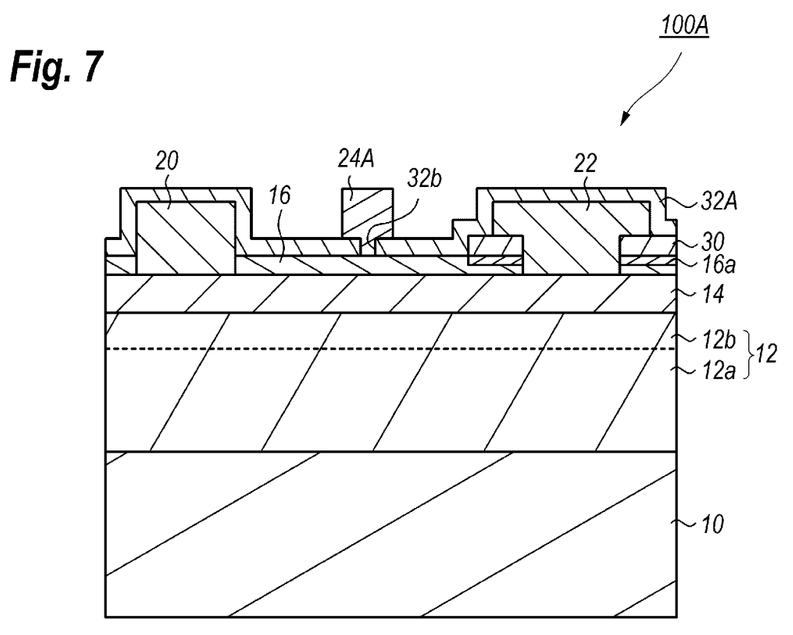
FIG. 7 shows a cross section of another semiconductor device according to the second embodiment of the present invention.

FIG. 7 shows a cross section of another semiconductor device according to the second embodiment of the present invention. The semiconductor device 100A shown in FIG. 7 has a feature distinguishable from the semiconductor device 100 of the first embodiment that the gate electrode 24A thereof has a T-shaped cross section with a horizontal bar thereof extending on the second SiN film 32A and only a bottom of the vertical bar of the T-shape in contact with the GaN layer 16. That is, the second SiN film 32A provides an opening 32b into which the gate electrode 24 fills therein so as to be in contact with the GaN layer 16. The semiconductor device 100A according to the second embodiment has a gate length of, for instance, 0.15 μm. Although not illustrated in FIG. 7, the semiconductor device 100A may further provide a still another SiN film covering the gate electrode 24A and the second SiN film 32A.

Figure 8A:
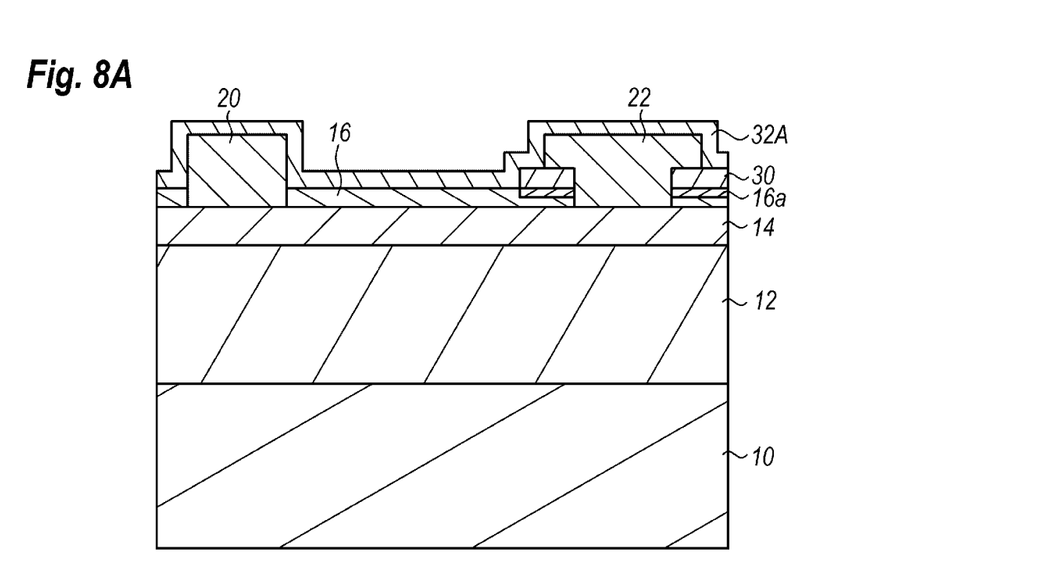
FIG. 8A and FIG. 8B show cross sections of the semiconductor device shown in FIG. 7 at respective processes of forming the semiconductor device.
Figure 8B:
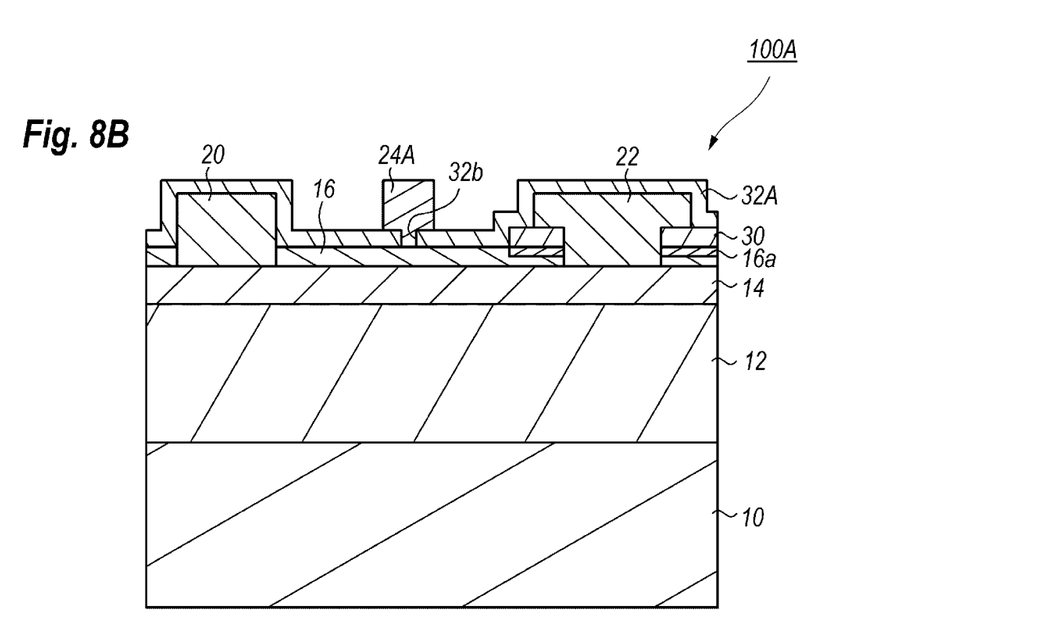

FIG. 8A and FIG. 8B show cross sections of the semiconductor device 100A shown in FIG. 7 at respective processes of forming the device 100A. The process shown in FIG. 8A and FIG. 8B has steps same with those shown from FIG. 2A to FIG. 5B, that is, the process forms the source electrode 20 and the drain electrode 22 by alloying the stacked metals and oxidizing the region of the GaN layer 16 in contact with the first SiN film 30 after depositing the first SiN film 30 with the Si-rich composition and the substantial oxygen content. Thereafter, the process deposits the second SiN film 32A before the formation of the gate electrode 24A, as shown in FIG. 8A. Forming an opening 32b, the gate electrode 24A is formed such that respective sides thereof extend on the second SiN film 32 while a center portion thereof fills the opening 32b to be in contact with the GaN layer 16. Because the semiconductor device 100A shown in FIG. 7 provides the oxide layer 16a formed by oxidizing the portion of the GaN layer 16 with oxygen (O) derived from the first SiN film 30 with the Si-rich composition and the substantial oxygen content during the heat treatment of the staked metals for the ohmic electrodes, 20 and 22. The oxide layer 16a may effectively bend the band profile of the GaN layer 16 upward, which enhances the resistivity of the GaN layer 16 only at the edge of the drain electrode, which reduces the current collapse and the leak current.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The present application claims the benefit of priority of Japanese Patent Application No. 2017-001304, filed on Jan. 6, 2017, which is incorporated herein by reference.

What is claimed is:

1. A process of forming a nitride semiconductor device on a substrate, comprising steps of:
    growing a semiconductor stack on the substrate, where the semiconductor stack includes at least a top layer containing gallium (Ga) and nitrogen (N), and doped with silicon (Si);
    forming a first insulating film made of silicon nitride (SiN) on the top layer of the semiconductor stack by a plasma-enhanced chemical vapor deposition (p-CVD) technique;
    forming a drain electrode by depositing ohmic metals on the semiconductor stack so as to have a portion overlapping with the first insulating film, and alloying the ohmic metals;
    forming a gate electrode on the semiconductor stack so as to be apart from the first insulating film; and
    covering the gate electrode, the drain electrode, and the first insulating film between the gate electrode and the drain electrode by a second insulating film formed by the p-CVD technique,
    wherein the p-CVD technique supplies silane ($SiH_4$) and nitrogen ($N_2$) as source gases for silicon (Si) and nitrogen (N) with a flow rate of $SiH_4$ for the first insulating film greater than a flow rate of $SiH_4$ for the second insulating film.

2. The process according to claim 1,
    wherein the first insulating film has a composition ratio of silicon against nitrogen (Si/N) that is greater than a composition ratio of silicon against nitrogen (Si/N) of the second insulating film.

3. The process according to claim 2,
    wherein the composition ratio (Si/N) of the first insulating film is greater than ¾.

4. The process according to claim 1,
    wherein the top layer of the semiconductor stack in a portion in contact with the first insulating film has oxygen contents after forming the drain electrode by alloying the ohmic metals.

5. The process according to claim 3,
    wherein the top layer of the semiconductor stack in the portion in contact with the first insulating film contains gallium oxide ($Ga_2O_3$) after forming the drain electrode by alloying the ohmic metals.

6. A process of forming a nitride semiconductor device on a substrate, comprising steps of:
    growing a semiconductor stack on the substrate, where the semiconductor stack includes at least a top layer containing gallium (Ga) and nitrogen (N), and doped with silicon (Si);
    forming a first insulating film made of silicon nitride (SiN) on the top layer of the semiconductor stack by a plasma-enhanced chemical vapor deposition (p-CVD) technique;
    forming a drain electrode by depositing ohmic metals on the semiconductor stack so as to have a portion overlapping with the first insulating film, and alloying the ohmic metals;
    forming a gate electrode on the semiconductor stack so as to be apart from the first insulating film; and
    covering the gate electrode, the drain electrode, and the first insulating film between the gate electrode and the drain electrode by a second insulating film formed by the p-CVD technique,
    wherein the p-CVD technique for the second insulating film uses a frequency higher than a frequency of the p-CVD technique for the first insulating film.

7. The process according to claim 6,
    wherein a composition ratio of silicon against nitrogen (Si/N) of the first insulating film is greater than ¾.

8. The process according to claim 6,
    wherein the top layer of the semiconductor stack in a portion in contact with the first insulating film has oxygen contents after forming the drain electrode by alloying the ohmic metals.

9. The process according to claim 8,
    wherein the top layer of the semiconductor stack in the portion in contact with the first insulating film contains gallium oxide ($Ga_2O_3$) after forming the drain electrode by alloying the ohmic metals.

* * * * *